United States Patent [19]

Hargis

[11] Patent Number: 5,771,324
[45] Date of Patent: Jun. 23, 1998

[54] POLARIZATION-PRESERVING FIBER OPTIC ASSEMBLY

[75] Inventor: David E. Hargis, La Jolla, Calif.

[73] Assignee: Laser Power Corporation, San Diego, Calif.

[21] Appl. No.: 791,248

[22] Filed: Jan. 30, 1997

Related U.S. Application Data

[63] Continuation-in-part of Ser. No. 642,305, May 3, 1996, and Ser. No. 676,821, Jul. 8, 1996.

[51] Int. Cl.$^6$ ..................................................... G02B 6/26
[52] U.S. Cl. .................................. 385/43; 385/31; 385/83; 385/11
[58] Field of Search ................................. 385/43, 31, 33, 385/38, 65, 83, 85, 88–94, 146, 11; 372/101

[56] References Cited

U.S. PATENT DOCUMENTS

| | | | |
|---|---|---|---|
| 4,252,407 | 2/1981 | Bubanko et al. | 385/83 X |
| 4,688,884 | 8/1987 | Scifres et al. | 385/31 X |
| 5,081,639 | 1/1992 | Snyder et al. | 372/101 |

*Primary Examiner*—Phan T. H. Palmer
*Attorney, Agent, or Firm*—Knobbe, Martens, Olson & Bear

[57] ABSTRACT

An optical fiber coupling assembly for substantially preserving polarization of transmitted optical radiation, including at least one multimode optical fiber situated in a housing that includes means for distributing pressure on the optical fiber and reducing stress on the multimode optical fiber. In one embodiment, the housing has a first and a second side, and includes a channel having a first end opening on the first side and a second end within the housing. A cavity connected to the second end of the channel is formed within the housing. An aperture formed in the housing connects the cavity to the second side. The channel, cavity, and aperture together provide a passageway for the optical fibers from the first side to the second side of the housing. In the preferred embodiment the aperture bundles a plurality of fibers together in an approximately circular cross-section. A laser such as a laser diode or laser diode array provides substantially polarized optical radiation that is coupled into a first end of the optical fibers. The optical radiation transmitted through the housing is outputted from the second side having substantially preserved polarization from the bundled second ends to provide a collective output beam having a substantially single polarization. The collective output beam is useful for pumping a solid state laser. The polarization preservation between the first and second ends may be greater than 70%, and in some embodiments greater than 90%.

25 Claims, 4 Drawing Sheets

POLARIZATION-PRESERVING FIBER OPTIC ASSEMBLY

This application is a continuation-in-part of Ser. No. 08/642,305, filed May 3, 1996 and assigned to the same assignee as herein, which is incorporated by reference herein, and a continuation-in-part of Ser. No. 08/676,821, filed Jul. 8, 1996 and assigned to the same assignee as herein, which is incorporated by reference herein.

BACKGROUND OF THE INVENTION

1. Field of the Invention

The present invention relates to fiber optic assemblies for transmitting optical radiation while substantially preserving polarization, and particularly to fiber optic assemblies that utilize multimode optical fibers to couple polarized light from a laser diode or an array of laser diodes.

2. Description of Related Art

It is well known to use one or more laser diodes to provide optical radiation to pump solid state lasers. A laser diode is a semiconductor device that emits laser radiation from a slit-like output aperture in response to an applied current. A laser diode may comprise a single emitter which provides a single beam, or for high power uses, an array of laser diodes such as a laser diode bar having multiple emitters can provide multiple beams. Laser diodes are a particularly efficient source of laser radiation and usually exhibit a high degree of linear polarization, although their output beam is multimode.

It is often advantageous to couple laser radiation emitted by a laser diode or a laser diode array through some type of fiber optic assembly to a remote location. Such a fiber optic assembly can be used to pump a laser device such as a solid state laser or for any other purpose wherein it is desired to transfer the output power of the laser diode to a remote point, such as applications involving illumination, metal processing and laser surgery. When multiple laser diode emitters are used the task of bringing all of the emitted light to a compact spot is complicated by the extent to which the individual emitters are geometrically spread along the length of the laser diode bar.

Many schemes have been proposed to couple optical radiation from diode lasers into fiber optic assemblies, such as those disclosed in U.S. Pat. Nos. 4,688,884 4,820,010, 5,081,639, 5,127,068, 5,168,401, and 5,293,269 However, these references do not address difficulties in preserving polarization once light is injected into the fiber.

Conventional fiber optic transmission systems for use with high power laser diode arrays use a plurality of multimode optical fibers situated to receive light from a laser diode array. The individual optical fibers are bundled together into a fiber optic cable which is routed to the location desired. Such a system can efficiently transmit the energy of the input optical radiation; however, one significant problem with such assemblies is loss of polarization of the input light, which is due to the fact that multimode fibers do not inherently preserve polarization. When linearly polarized light is injected into a multimode optical fiber, the light eventually becomes randomly polarized, due in part to the various transverse modes of the fiber, which allow various polarization states to become excited as the light propagates along the fiber.

For some important uses, polarization preservation is very advantageous. For example, for some solid state gain media used in optically-pumped solid state lasers, the pump's polarization can significantly affect the absorption characteristics of the solid state gain media. Particularly, in those media, optical radiation having a first polarization is highly absorbed, while optical radiation having a second, orthogonal polarization is only slightly absorbed, and in such cases the optical radiation at only the first polarization is effectively utilized while optical radiation at the second polarization is wasted or requires a significantly longer gain medium. If the pumping radiation is randomly polarized, then half of the pumping radiation may be wasted, and furthermore, the presence of the unabsorbed optical radiation at the second polarization may have undesirable effects on operation of other optical components in a system.

Optical fibers are available as single mode fibers and multimode fibers. Single mode fibers have a very small core diameter (e.g. 4 microns) in order to transmit only a single lasing mode, and can be employed for low power uses (i.e. less than 100 mW). Furthermore, some single mode fibers are specially designed to preserve polarization. Single mode fibers generally require a single mode source of optical radiation because a multimode source cannot be coupled efficiently into single mode optical fiber. Multimode sources can couple energy much more efficiently into a multimode fiber, which has a larger core diameter (e.g. 100 microns or greater) and can simultaneously transmit multiple lasing modes. Furthermore, the larger diameter of multimode fibers allows them to transmit much higher optical powers than single mode fibers. Multimode fibers are used extensively to transmit optical radiation from laser diodes, which produce multimode optical radiation.

SUMMARY OF THE INVENTION

In accordance with the objectives of this invention as described above and to overcome the limitations of the prior art, a fiber optic assembly utilizing a multimode optical fiber is provided that preserves the polarization of the input light. Polarization is preserved by employing structures that reduce the stresses placed on the fiber which in turn reduces depolarization of the light.

An optical fiber coupling assembly is provided that transmits optical radiation from a source having a predetermined polarization. The assembly comprises at least one multimode optical fiber having a first end for receiving the polarized optical radiation and a second end for outputting the optical radiation. A housing for the optical fiber is provided that includes means for distributing pressure and reducing stress on the multimode optical fiber such that the predetermined polarization is substantially preserved at the second end. In one embodiment, a laser diode or a laser diode array provides the source of optical radiation. The polarization preservation between the first and second ends may be greater than 70%, and in some embodiments greater than 90%.

In a preferred embodiment, the optical fiber coupling assembly comprises at least one multimode optical fiber having a first end for receiving the polarized optical radiation and a second end for outputting the substantially polarized optical radiation. The housing has a first side and a second side, and includes a channel having a first end opening on said first side and a second end within said housing, a cavity formed within that housing that is connected to a second end of said channel, and an aperture for connecting the cavity and the second side. The channel, cavity, and aperture together provide a passageway for the optical fibers from the first side to the second side of the housing.

In one useful embodiment, a laser diode array having a plurality of emitters provides substantially polarized optical radiation. A plurality of optical fibers are provided in the housing, having first ends on the first side of the housing arranged to receive optical radiation from said laser diode array. The second ends of the optical fibers are bundled together on the second side of the housing. In operation, the polarized optical radiation is coupled from the laser diode array into the first ends of the plurality of optical fibers, and transmitted through the optical fibers within the housing while substantially preserving polarization. The optical radiation is output from the second side having substantially preserved polarization from the bundled second ends to provide a collective output beam having a substantially single polarization. In some embodiments, the collective output beam has an approximately circular cross-section, which is useful for coupling into a solid state laser. Advantageously, high optical power can be transmitted by using a plurality of the optical fibers in the coupling assembly; particularly, the number of optical fibers can be scaled to meet predetermined power requirements.

The foregoing, together with other objects, features and advantages of this invention, will become more apparent when referring to the following specification, claims and the accompanying drawings.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE PREFERRED EMBODIMENT

This invention is described in a preferred embodiment in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

For purposes of this application, the term polarization by itself refers to what is known as "linear" polarization, in which light is polarized in a set direction orthogonal to the axis of propagation. "Polarization preservation" is defined as the percentage of the polarization of the incoming light that is preserved within a unit distance of the fiber. As discussed in the background section herein, after linearly polarized light is injected into a multimode optical fiber, the light begins to become randomly polarized. It is believed that the distance over which the light becomes randomly polarized is a function of the input numerical aperture of the laser beam, the numerical aperture of the optical fiber, the core diameter of the optical fiber, and the degree of microbends and stresses to which the fiber is exposed, the latter of which appears to be a very important factor. In prior art fiber optic assemblies used for transmitting laser light, the system is usually made flexible to allow connection to a remote device such as a solid state laser, and such flexible connections typically place stress on the fibers, which in turn scrambles the polarization of the light within a short distance. In comparison, the present invention provides a structure that holds the fibers in place while reducing the stress and pressure upon each optical fiber and therefore polarization preservation is substantially improved.

Figure 1:
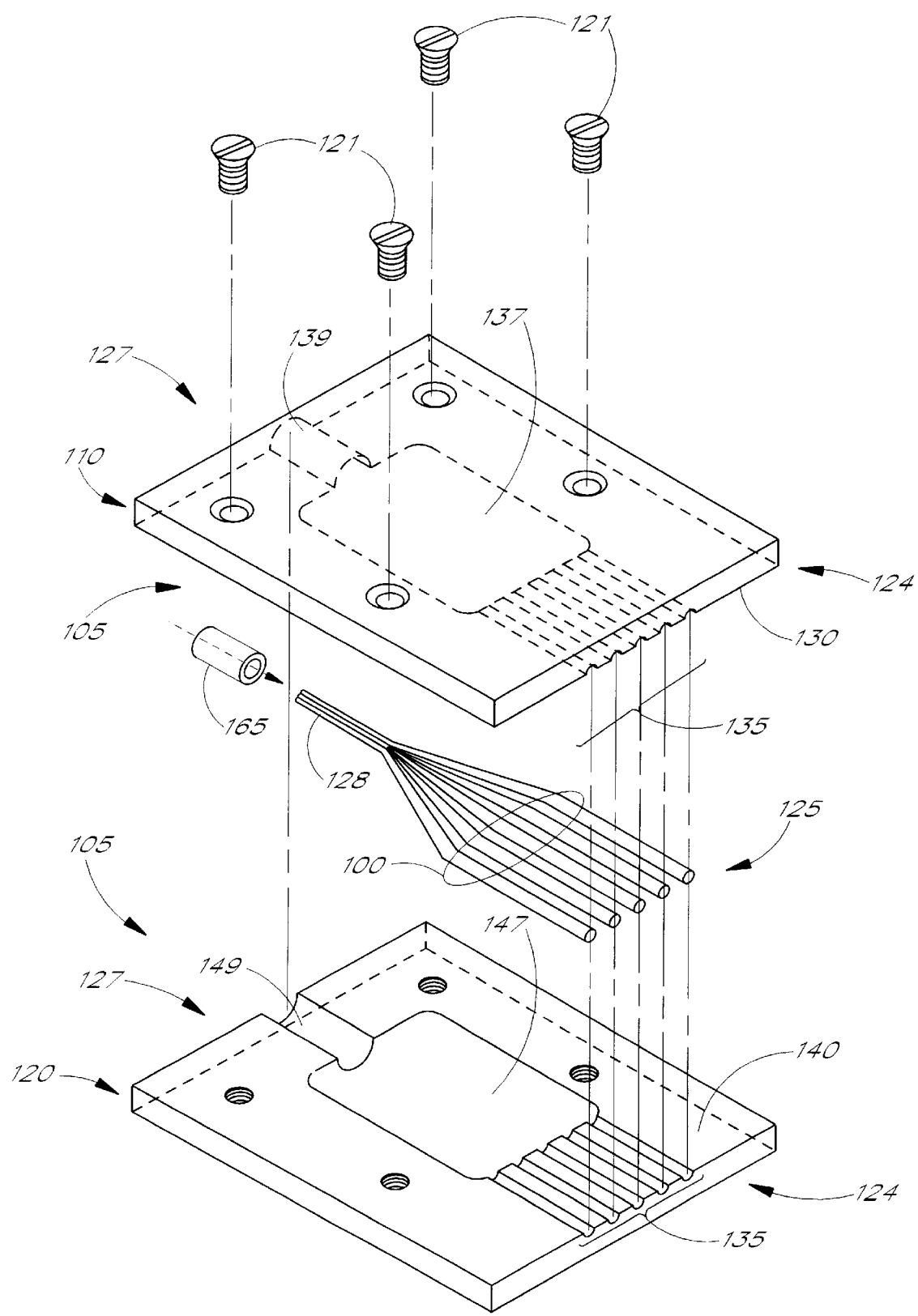
FIG. 1 is an exploded view of a housing and a plurality of optical fibers to be positioned therein.

Reference is now made to FIG. 1, which is an exploded view of a plurality of optical fibers 100 and a preferred embodiment of a housing 105 that includes an upper housing section 110 and a lower housing section 120. The upper and lower sections are designed to fit together, with the optical fibers therebetween, in such a was as to reduce pressure and stress on the optical fibers and also to reduce the maximum angle at which any particular optical fiber is bent by, for example, distributing stress and pressure on the optical fiber to reduce microbends and pressure at any particular point, and where a bend is necessary, allowing the optical fiber to bend gradually. It is believed that such features significantly improve polarization preservation.

Referring still to FIG. 1, a plurality of multimode optical fibers 100 are positioned between the upper and lower housing sections. The optical fibers 100 comprise any suitable multimode optical fibers, and preferably, each fiber includes a core encased in a cladding. A central axis is defined through the center of the cross-section of each fiber. Each fiber may have a small core diameter such as about 100 to 300 microns, or a larger core diameter such as about 500 to 1000 microns. Each optical fiber may have any suitable cross-section, such as circular, elliptical, rectangular or square. It is believed that a square cross-section is preferable for polarization preservation; however, cylindrical fibers are readily available in many sizes at low cost and they can be easily positioned and assembled. One preferred cylindrical fiber has a circular cross-section with a diameter between about 100 and 300 microns, which is large enough to receive the full beam width (about 100 to 200 microns) yet small enough to minimize the brightness reduction caused by coupling a relatively smaller cross-section beam into the larger cross-section of the fiber. Although FIG. 1 shows five optical fibers, in other preferred embodiments the number of optical fibers may chosen to provide a predetermined optical power and/or a predetermined output pattern.

The housing 105 is designed to provide a solid, stable support structure when assembled with the optical fibers situated therebetween. The upper and lower housing sections 110 and 120 may be constructed of aluminum; however, in the preferred embodiment, the housing sections are formed of a hard material, such as ceramic, glass, quartz, or a hard metal, chosen to provide grinding characteristics similar to those of the optical fiber. Particularly, a housing made of such materials can facilitate subsequent operations that grind and polish the optical fibers to predefined configurations. The upper and lower sections of the housing are held together by any suitable affixing means, such as screws or bolts 121 that are inserted through suitable holes formed in the housing. In alternative embodiments, appropriate adhesives or clamps, among other means, could be used to secure the housing sections together.

In the embodiment shown in FIG. 1, the upper section 110 and the lower section 120 each comprise an approximately box-like outer configuration for convenience of manufacture and handling. It should be apparent that in other embodiments the outer configuration could have a variety of shapes. The housing defines a first side 124 where first ends 125 of the optical fibers exit from the housing, and a second side 127 where second ends 128 of the optical fibers exit from the housing.

The upper and lower sections each have an inner surface designed to align with the plurality of fibers therebetween; particularly, the upper section has an inner surface 130 and the lower section has a corresponding inner surface 140. The inner surface 130 of the upper section includes a plurality of parallel grooves 135 extending inwardly from the first side 124 to a hollow section 137 formed on the inner surface. A half-cylindrical opening 139 formed on the inner surface connects the hollow section 137 with the second side 127 of the housing. The inner surface 140 of the lower section is also formed with a plurality of grooves 145 extending inwardly from the first side 124 to a hollow section 147, which is connected on its opposite side to a half-cylindrical opening 149 between the hollow section 147 and the second side 127.

Each of the parallel grooves 135 on the inner surface 130 is designed to align with a corresponding parallel groove 145 on the inner surface 140, in order to define a plurality of parallel channels that securely hold the optical fibers 100 in position. The grooves 135 and 145 are designed to provide parallel channels having a shape that corresponds to the outer perimeter of its corresponding optical fiber, in order to distribute the stress and pressure imposed by the channel upon the optical fiber over the entire length of the channel. Preferably, each groove has a wedge shape with two flat surfaces that hold a circular fiber between them. In other embodiments, the grooves may have a shape that matches the outer perimeter of the optical fibers; for example if the outer perimeter is circular, the grooves may have a corresponding cylindrical shape. The channels are preferably very smooth in order to reduce unevenness that may cause stress or bending of the fiber. The optical fibers may be adhesively bonded into the channels by any suitable adhesive, for example epoxy. If no adhesive is used, the channels should be made long enough to provide enough friction to securely hold the optical fiber situated therein.

The hollow sections 137 and 147 are aligned together to define an internal cavity that provides an unrestricted passageway for optical fibers exiting from the channels, thereby eliminating pressure and stress on the optical fibers within the passageway. Furthermore, the unrestricted passageway allows the optical fibers to gradually bend with a minimum of stress.

The half-cylindrical sections 139 and 149 are aligned together to provide a cylindrical output aperture that collects the optical fibers together to form a fiber optic bundle, which is directed out from the second side 127. The half-cylindrical sections 139 and 149 are designed to securely hold together the output ends of the fibers 100.

In order to properly position the bundle of optical fibers 100 in its output groove 139, 149, a sleeve 165 may first be inserted over the optical fibers. Then, the sleeve with the fibers running therethrough is positioned in the output aperture and the fibers are positioned within the channels. The fibers are laid out to loosely extend from the aperture to the channels: too much tension will cause the optical fiber to sharply bend at the channel and aperture, and too much slack could allow the excess fiber to have unwanted bends. An epoxy or some other adhesive material is useful to hold the fibers in position at the output aperture, and particularly around the sleeve. The epoxy or other adhesive material may also be used to hold the fibers within the channels, if desired.

Figure 2:
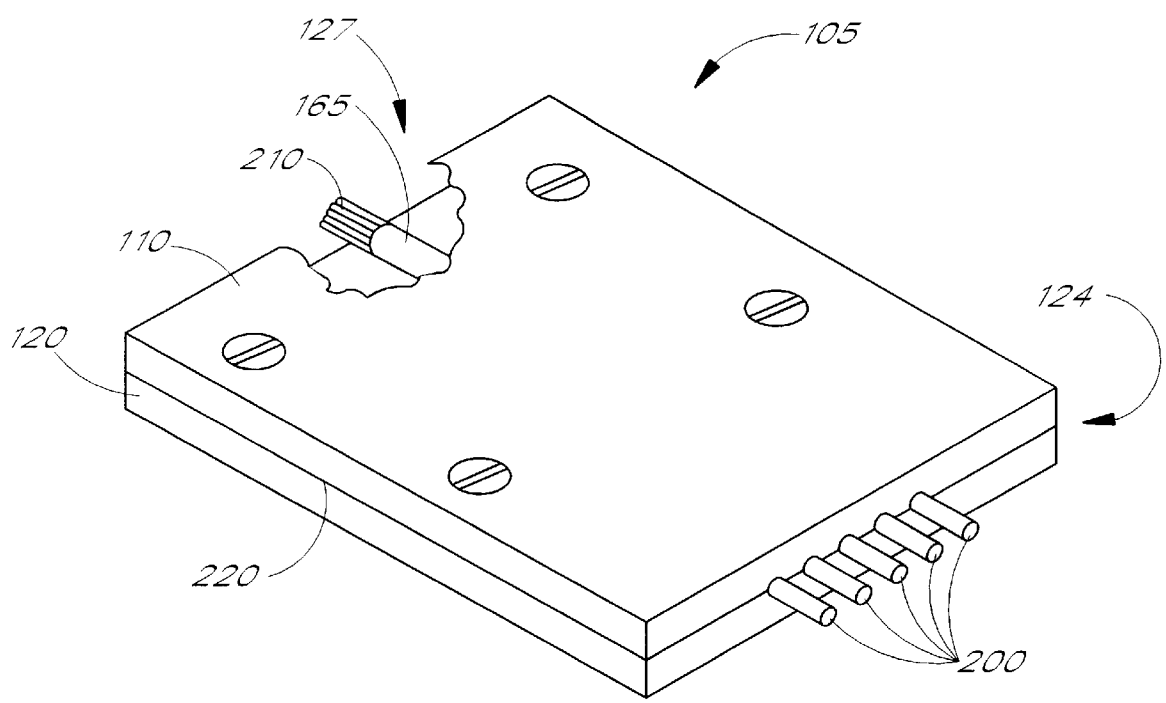
FIG. 2 is an assembled view of the unfinished housing of FIG. 1 with the optical fibers positioned therebetween.

Reference is now made to FIG. 2, which is a perspective view of an assembled fiber optic assembly 105 in which the upper section 110 has been connected to the lower section 120 and the plurality of fibers 100 are enclosed between the upper and lower sections. The optical fibers initially include a protruding section 200 extending from first side 124 of the housing, and a plurality of closely positioned ends 210 protruding from the second side 127.

To form a completed coupling assembly the protruding ends 210 at the second side are cut as closely as possible to the housing. The cut ends of the fibers in the bundle are then ground and polished to provide a smooth flat output facet on each of the fibers. As a result, output facets are formed in each optical fiber approximately parallel with each other and with the output side of the housing.

Figure 3:
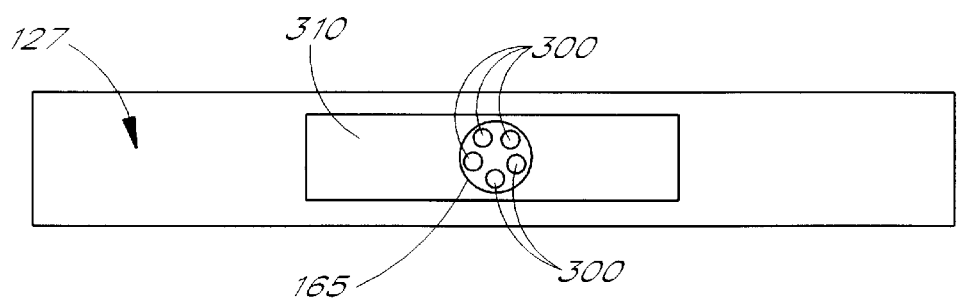
FIG. 3 is a plan view of the second side of the housing of FIG. 2, the end having been polished so that the output facets have a flat smooth surface.

FIG. 3 is a plan view of second side 127 of the housing. The output side has been polished to provide a plurality of output facets 300 on the optical fibers. In FIG. 3 an optional glass plate 310 having a hole for inserting the optical fibers is situated on the second side 127. To form such an configuration, the glass plate 310 is inserted over the protruding fiber bundle and affixed on the second side 127 by any suitable means such as a suitable adhesive. The fiber ends extending from the glass plate are cut approximately evenly with the glass plate, and then ground to provide smooth output facets on the fiber ends. The glass plate 310 advantageously provides a surface that has grinding characteristics similar to the optical fibers, which facilitates grinding and polishing the output facets 300 to as smooth a surface as possible. Preferably, an anti-reflection (AR) coating is deposited on the output facets 300 of the optical fibers. For example a dielectric AR coating such as single layer of magnesium fluoride ($MgF_2$) can be designed to efficiently transmit a predetermined wavelength of the beam transmitted through it. However, in the preferred embodiment the dielectric coating comprises multiple layers of any conventional dielectric material that improves transmissivity.

Although the output facets 300 in FIG. 3 are arranged in an approximately circular configuration, other embodiments may have different configurations. For example, the output facets 300 may be arranged in a hexagonal configuration or a rectangular configuration. Preferably, the output facets are arranged in such a way that they are as closely packed as possible, while still having the desired configuration. For any particular embodiment, an optimum close packed configuration can be determined using such factors as the number of optical fibers, their size, and their shape.

Figure 4:
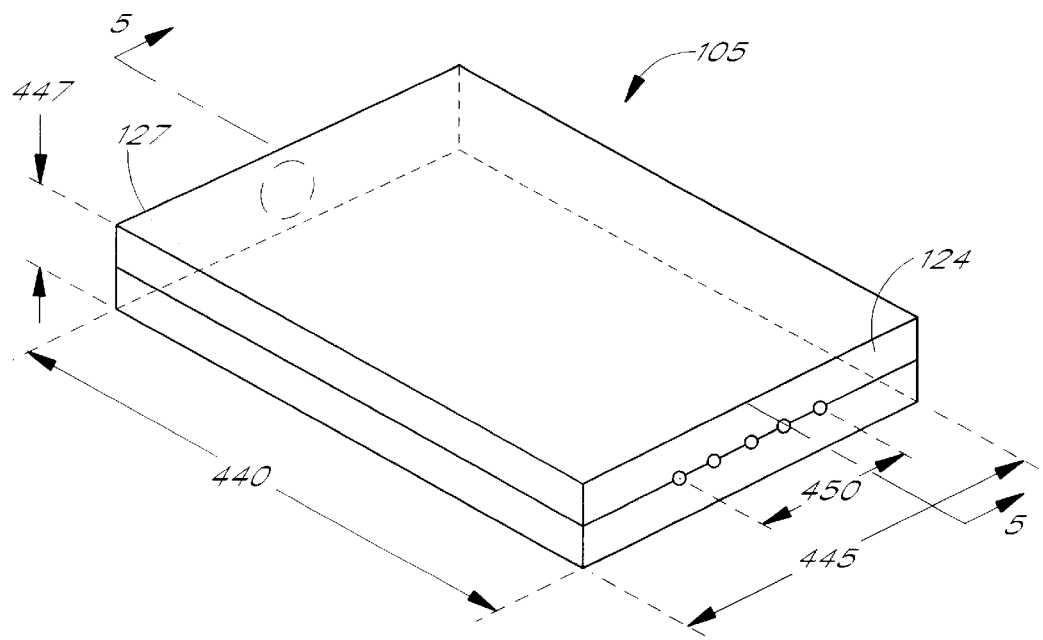
FIG. 4 is a perspective view of a complete, assembled fiber optic coupling assembly.

Reference is now made to FIG. 4 to show one embodiment of a completed fiber optic assembly. On their input end 200, the protruding optical fibers are cut as closely as possible to the first side 124 of the housing, and then polished to provide as smooth a surface as possible. In some embodiments (not shown) a glass plate can be affixed to the input surface and used to provide a surface for grinding, in a similar manner as the glass plate 310 is used in FIG. 3.

In the embodiment shown in FIG. 4, the first side 124 is maintained at an approximately 90° angle. However, in alternative embodiments (not shown), the first side 124 may be formed with a predetermined shape such as the tapered shape disclosed in Ser. No. 08/642,305, filed May 3, 1996 and assigned to the same assignee as herein, which is incorporated by reference herein. In other alternative embodiments the first side 124 may be formed with the curved shape disclosed in Ser. No. 08/676,821, filed Jul. 8, 1996 and assigned to the same assignee as herein, which is incorporated by reference herein.

Figure 5:
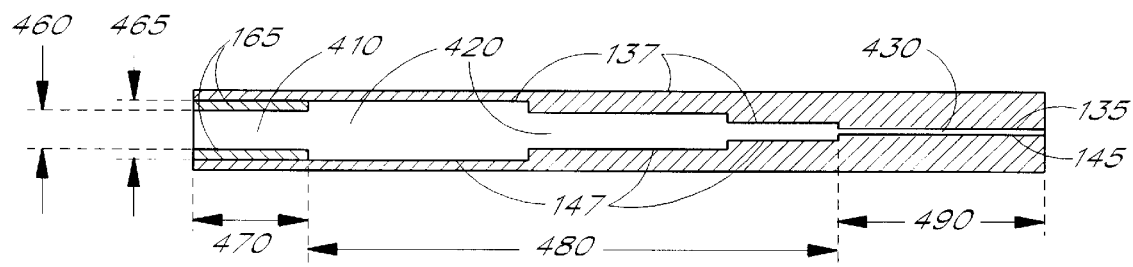
FIG. 5 is a cross-sectional view taken lengthwise and vertically along the fiber optic coupling assembly, as shown in FIG. 4

Reference is now made to FIG. 5, which is a cross-sectional view taken lengthwise and vertically through one embodiment of the fiber optic coupling assembly shown in FIG. 4, with the fiber optic cables omitted for convenience of description. FIG. 5 shows an aperture 410 formed within the sleeve 165, a cavity 420 defined between the two hollowed sections, and a channel 430 formed between the upper groove 135 and the lower groove 145. In the embodiment shown in FIG. 5, the cavity has a plurality of steps formed on its surfaces; other embodiments may eliminate these steps. Preferably, the steps in the illustrated embodiment do not interfere with or contact the optical fibers passing through the cavity 420.

One exemplary embodiment of the fiber optic assembly is described with reference to FIGS. 4 and 5. In this exemplary embodiment, the fiber optic assembly 105 has a lengthwise dimension 440 of approximately 1.5 inches in length and a width 445 of approximately 0.75 inches. A height 447 of the assembly is approximately 0.15 inches. Nineteen optical fibers are linearly arranged on the first side 124, each having a core diameter of about 200 microns (only five fibers are shown in FIG. 4). The total distance 450 across the linearly arranged fibers is approximately 7.0 mm. On the second side 127 of the assembly, the fibers are arranged in a bundle having a close packed hexagonal structure.

Referring now to FIG. 5, an inner diameter 460 of the sleeve 165, which is approximately the diameter of the fiber bundle, is about 1.3 mm. An outer diameter 465 of the sleeve is about 0.126 inches. The sleeve has a length 470 of about 0.18 inches. The cavity 420 has a length 480 of about 1.11 inches and a width (not shown) of about 0.408 inches. The channels 430 have a length of about 0.210 inches.

In the above embodiment, polarization preservation was observed to be high. Particularly, with a plurality of circular fibers over a distance of about 1.5 inches, a 90% to 95% preservation of polarization was observed. Furthermore, advantageously all beams exit with the same direction of polarization; for example if the polarization is uniform across the plurality of inputs, the polarization at the output will have that same uniform polarization at the output. The polarization preservation properties may be useful, for example, for use within a diode-pumped solid state laser, an electro-optic switch that switches the output beam or any of a number of uses. Another use for a polarized beam is to light an LCD (liquid crystal display) display. Although the circular fibers showed a high degree of polarization preservation, it is believed that the rectangular cross-section would provide an even greater degree of polarization preservation. Therefore, for those uses in which polarization preservation is important, the rectangular cross-section fiber may be particularly useful.

Figure 6:
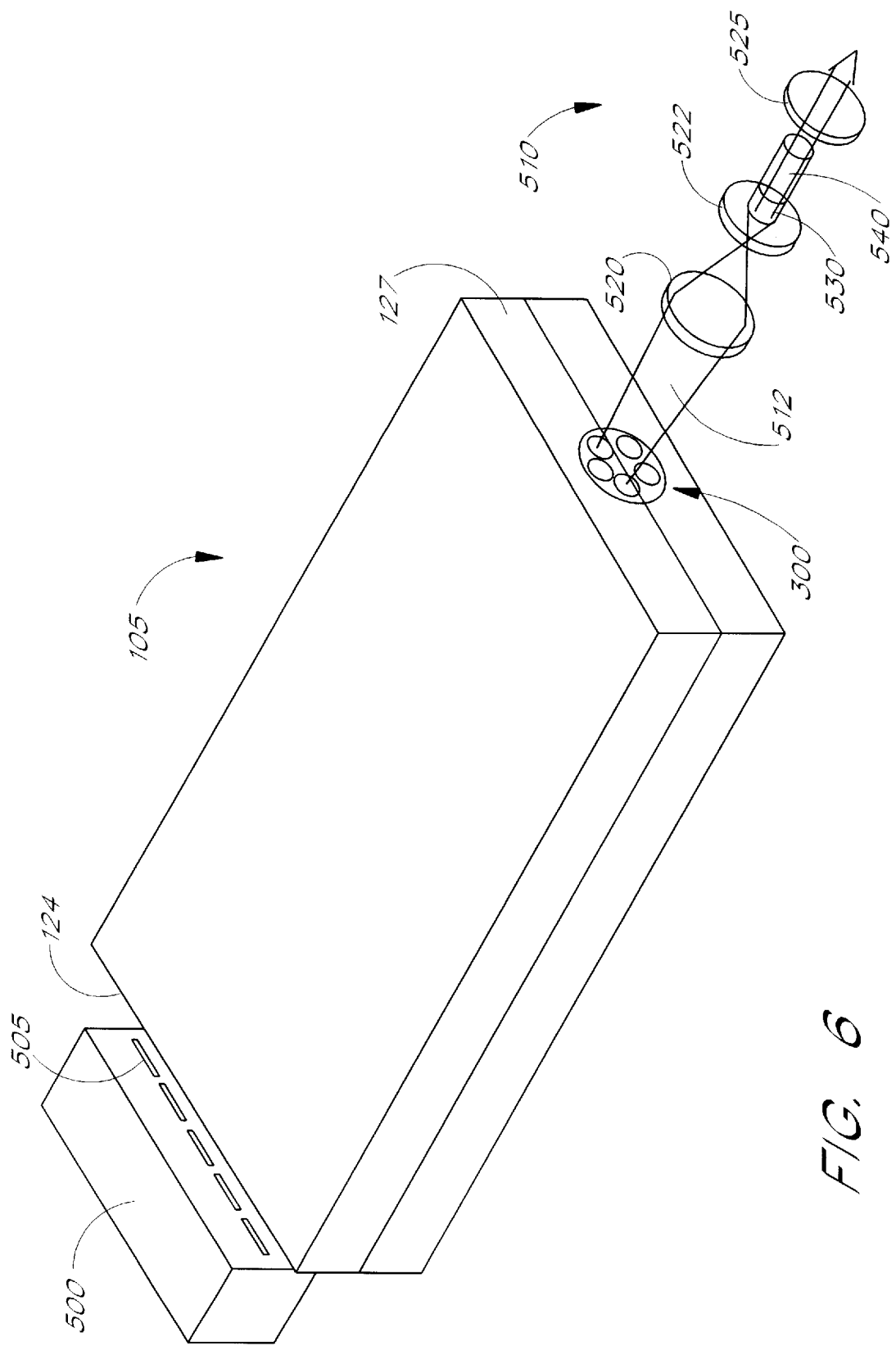
FIG. 6 is a perspective view of a laser diode array coupled by the fiber optic coupling assembly to end pump a solid state laser.

Reference is now made to FIG. 6 which is a perspective view of a configuration in which a laser diode array 500 having a plurality of emitters 505 that emit substantially polarized optical radiation is coupled via the fiber optic coupler assembly to end pump a solid state laser 510. Particularly, the laser diode array 500 is positioned to effectively couple the light from the emitters 505 into the fibers at the first side of the fiber optic coupling assembly while substantially retaining the polarization. In this embodiment, the center-to-center spacing of the input facets on the optical fibers is arranged to match the center-to-center spacing of the outputs of the diode array.

Various schemes can be employed to couple the laser light from the emitters into the fiber optic assembly. For example, Baer in U.S. Pat. No. 5,127,068 discloses using a multimode optical fiber situated crosswise in the beam path as a microlens to collimate the output emissions for coupling into an optical fiber. Alternative microlenses could be used, such as disclosed by Snyder in U.S. Pat. No. 5,081,639. Other schemes for coupling the laser light are discussed in Ser. No. 08/642,305, referenced above, in which the input side of the fiber has a tapered shape to couple the output emissions from the laser diode in a longitudinal direction, or in Ser. No. 08/676,821, in which the input side of the fiber has a curved shape in order to couple the output emissions from the side.

The light coupled into the optical fibers is transmitted through the assembly and then emitted from the output facets 300 of the optical fibers to provide a collective beam 512, which is defined by a collection of the separate (but closely positioned) beams from the output facets. Preferably, the output facets 300 are arranged in a circular configuration so that the collective beam has a circular cross-section; however in other embodiment the output facets may be arranged in a rectangle, a hexagon or other any other suitable configuration. In order to pump a solid state laser in one embodiment, the output facets 300 should be positioned as closely together as possible in order to provide a collective beam with reduced intensity variation. The collective beam 512 is used in this example to optically pump a solid state laser, although it should be apparent that it could also be used for other purposes.

In the exemplary solid state laser shown in FIG. 6, the collective beam is imaged by a conventional lens 520 into the solid state laser 510 that comprises a laser cavity defined between an input coupler 522 and an output coupler 525. In an alternative embodiment (not shown), a conventional two-lens coupling assembly could be used to image the collective beam, with a first lens collimating the diverging collective beam and a second lens imaging the collimated beam into the solid state gain medium. The imaged collective beam operates as a pump beam to pump a solid state gain medium 530, such as Nd:YVO$_4$ which is positioned within the laser cavity to produce a fundamental laser emission. A frequency doubling crystal 540, or other non-linear optical material, is positioned within the laser cavity to frequency convert the fundamental laser emission to another frequency. The collective beam 512 is coupled into the solid state gain medium by any suitable means, for example by butt-coupling. Preferably, the collective beam 512 is focused tightly near the input end of the gain medium 530 in order to "end pump" the gain medium in a conventional manner to provide a laser emission within the laser cavity.

The input coupler 522 is transmissive at the wavelength of the pump beam and reflective at the lasing wavelength. The output coupler 525 is at least partially transmissive at an output wavelength, which in some embodiments is the same as the lasing wavelength, while in other embodiments the output wavelength may be different; for example if the nonlinear material comprises a doubling crystal, the output coupler will be reflective at the lasing wavelength and transmissive at the converted wavelength. In some embodiments, the end reflectors (i.e., the input and output couplers) for a solid state laser can be deposited directly on the faces of the solid state gain medium.

Other embodiments and modifications of this invention may occur to those of ordinary skill in the art in view of these teachings. For example, the outer configuration of the housing could comprise a curved shape. The optical fibers need not be collected into a single bundle; instead they may be divided into several bundles, or in some embodiments, the fibers can individually exit from the assembly. The number of fibers in any embodiment can vary from one to many; preferably the number of optical fibers is equal to the number of emitters in the laser diode array. Therefore, this invention is to be limited only by the following claims, which include all such embodiments and modifications when viewed in conjunction with the above specification and accompanying drawings.

What is claimed is:

1. An optical fiber coupling assembly for transmitting optical radiation from a source having a predetermined polarization, comprising:

a multimode optical fiber having a first end for receiving said optical radiation with the predetermined polarization and a second end for outputting said optical radiation;

a housing including a means for holding the multimode optical fiber such that the predetermined polarization is substantially preserved at the second end.

2. The optical fiber coupling assembly of claim 1 wherein the polarization preservation between the first and second ends is greater than 70%.

3. The optical fiber coupling assembly of claim 2 wherein the polarization preservation between the first and second ends is greater than 90%.

4. The optical fiber coupling assembly of claim 1 for coupling optical radiation from a plurality of sources having the predetermined polarization and further comprising:

a plurality of multimode optical fibers each having a first end for receiving said optical radiation with the predetermined polarization and a second end for outputting said optical radiation; and the housing includes a means for distributing pressure on the plurality of optical fibers and reducing stress such that the predetermined polarization is substantially preserved at the second end.

5. The optical fiber coupling assembly of claim 4 and further comprising means for bundling said plurality of multimode optical fibers at their second ends.

6. The optical fiber coupling assembly of claim 1 wherein the housing further includes means for distributing pressure on the optical fiber and reducing stress on the multimode optical fiber.

7. The optical fiber coupling assembly of claim 1 and further comprising a laser diode for providing the source of optical radiation.

8. An optical fiber coupling assembly for transmitting optical radiation from a source having a predetermined polarization, comprising:

a multimode optical fiber having a first end for receiving said optical radiation with the predetermined polarization and a second end for outputting said optical radiation;

a housing having a first side and a second side, and also including a channel having a first end opening on said first side and a second end within said housing;

a cavity formed within said housing, said cavity connected to said second end of said channel;

an aperture for connecting said cavity and said second side;

said channel, said cavity, and said aperture providing a passageway for said optical fiber from said first side of the housing to said second side of the housing; and wherein said housing minimizes stresses and pressures on said fiber, thereby substantially maintaining the polarization of optical radiation transmitted through said fiber.

9. The optical fiber coupling assembly of claim 8 wherein the polarization preservation between the first and second ends is greater than 70%.

10. The optical fiber coupling assembly of claim 9 wherein the polarization preservation between the first and second ends is greater than 90%.

11. The optical fiber coupling assembly of claim 8 and further comprising a laser diode for providing the source of optical radiation.

12. An optical fiber coupling assembly for transmitting optical radiation from a plurality of sources having a predetermined polarization, comprising:

a plurality of multimode optical fibers each having a first end for receiving said optical radiation with the predetermined polarization and a second end for outputting said optical radiation; and a housing having a first side and a second side, and also including a plurality of channels each having a first end opening on said first side and a second end within said housing;

a cavity formed within said housing, said cavity connected to said second ends of said plurality of channels;

at least one aperture for connecting said cavity and said second side;

said plurality of channels, said cavity, and said at least one aperture providing a passageway for said plurality of optical fibers from said first side of the housing to said second side of the housing; and whereby the polarization of optical radiation transmitted through said plurality of optical fibers is substantially preserved.

13. The optical fiber coupling assembly of claim 12 wherein the polarization preservation between the first and second ends is greater than 70%.

14. The optical fiber coupling assembly of claim 13 wherein the polarization preservation between the first and second ends is greater than 90%.

15. The optical fiber coupling assembly of claim 12 wherein said aperture holds said plurality of multimode optical fibers at their second ends in a single bundle.

16. The optical fiber coupling assembly of claim 15 wherein said bundle comprises an approximately circular cross-section.

17. The optical fiber coupling assembly of claim 12 and further comprising a laser diode array for providing the plurality of sources of optical radiation.

18. A method of coupling optical radiation from a laser diode array that provides substantially polarized optical radiation, comprising the steps of:

providing a housing having a first side, a second side, and a plurality of fibers connected between said first and second sides within said housing, said plurality of fibers having a plurality of first ends on said first side arranged to receive said optical radiation from said laser diode array and a plurality of second ends on said second side bundled together;

coupling said polarized optical radiation into the first ends of the plurality of optical fibers;

transmitting said polarized optical radiation through said housing while substantially preserving polarization;

outputting said optical radiation having substantially preserved polarization from the bundled second ends to provide a collective output beam having a substantially single polarization.

19. The method of claim 18 and further comprising the step of preserving polarization between said first and second ends of the optical fiber in an amount greater than 70%.

20. The method of claim 19 and further comprising the step of preserving polarization between said first and second ends of the optical fiber in an amount greater than 90%.

21. The method of claim 18 wherein said optical radiation is output from said second ends so that said collective output beam has an approximately circular cross-section.

22. The method of claim 18 and further comprising the steps of coupling said collective output beam into a solid state laser.

23. An optical fiber coupling assembly for transmitting optical radiation comprising:

an optical radiation pumping source capable of emitting optical radiation having a predetermined polarization;

a plurality of multimode optical fibers each having a first end positioned to receive said optical radiation with the predetermined polarization into said multimode optical fiber and a second end for outputting said optical radiation;

a housing including a means for holding the multimode optical fiber such that the predetermined polarization is substantially preserved at the second end.

24. The optical fiber coupling assembly of claim 23 further including a solid state laser positioned to receive said optical radiation from said second end.

25. The optical fiber coupling assembly of claim 23 wherein said radiation pumping source includes a laser diode array having a plurality of emitters.

* * * * *